United States Patent
Fink et al.

(10) Patent No.: US 11,108,094 B2
(45) Date of Patent: Aug. 31, 2021

(54) METHOD AND DEVICE FOR USING AN ELECTROCHEMICAL ENERGY STORE SO AS TO OPTIMIZE THE SERVICE LIFE

(71) Applicant: SIEMENS AKTIENGESELLSCHAFT, Munich (DE)

(72) Inventors: Rafael Fink, Munich (DE); Kurt Majewski, Munich (DE); Martin Seydenschwanz, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 505 days.

(21) Appl. No.: 16/093,241

(22) PCT Filed: Apr. 14, 2016

(86) PCT No.: PCT/EP2016/058281
§ 371 (c)(1),
(2) Date: Oct. 12, 2018

(87) PCT Pub. No.: WO2017/178057
PCT Pub. Date: Oct. 19, 2017

(65) Prior Publication Data
US 2021/0218076 A1    Jul. 15, 2021

(51) Int. Cl.
*H01M 10/44* (2006.01)
*G01R 31/367* (2019.01)
*G01R 31/392* (2019.01)

(52) U.S. Cl.
CPC ........ *H01M 10/443* (2013.01); *G01R 31/367* (2019.01); *G01R 31/392* (2019.01)

(58) Field of Classification Search
CPC .. H01M 10/443; G01R 31/367; G01R 31/392
See application file for complete search history.

(56) References Cited

FOREIGN PATENT DOCUMENTS

| DE | 102009024422 A1 | 1/2011 |
| DE | 202014008428 U1 | 11/2014 |
| DE | 10 2014 215309 A1 | 2/2016 |
| DE | 102014215309 A1 | 2/2016 |

OTHER PUBLICATIONS

Indian Office Action dated May 21, 2020 for Indian Application No. 201847038652.
International Search Report for PCT/EP2016/058281.
John Wang et al: "Cycle-life model for graphite-LiFePOcells", Journal of Power Sources. Elsevier SA. CH. vol. 196. No. 8. Nov. 23, 2010 (Nov. 23, 2010). pp. 3942-3948.

*Primary Examiner* — Stacy Whitmore
(74) *Attorney, Agent, or Firm* — Schmeiser, Olsen & Watts LLP

(57) ABSTRACT

A method and a device for using an electrochemical energy store so as to optimize the service life is provided. The cyclical aging of the energy store is expressed in the form of a nonlinear function based on the temperature which can be influenced by a charging and/or discharging process of the energy store and the energy throughput. The nonlinear function is linearly approximated in order to determine the cyclical aging in each interval which can be specified for subdividing a specifiable usage planning period and is used to calculate a service life-optimizing plan for using the energy store.

12 Claims, 7 Drawing Sheets

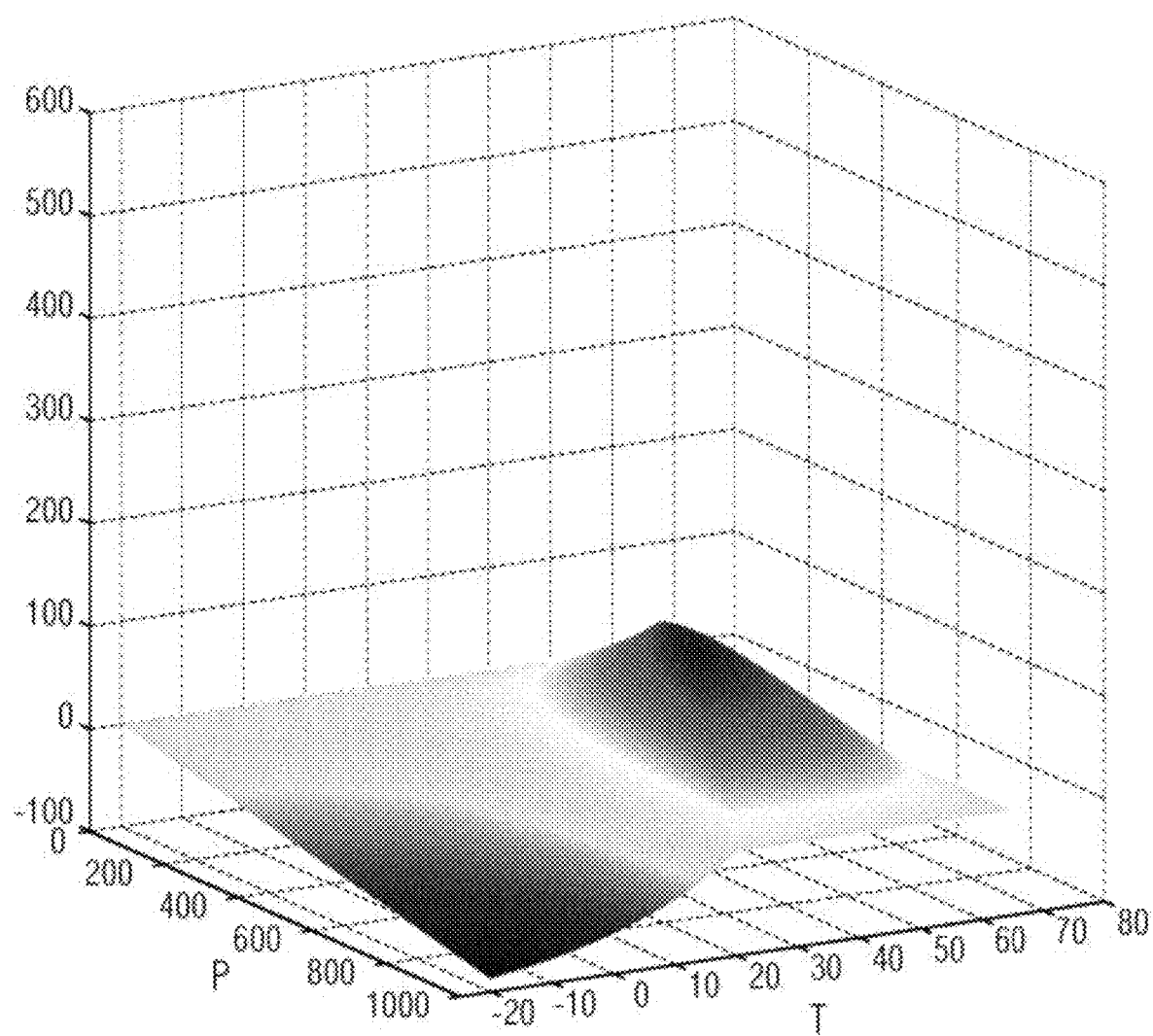

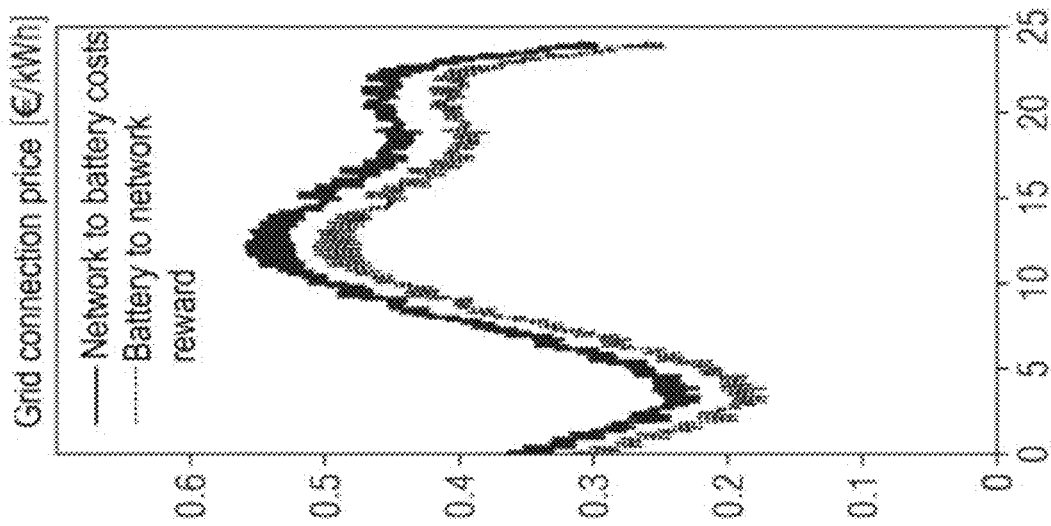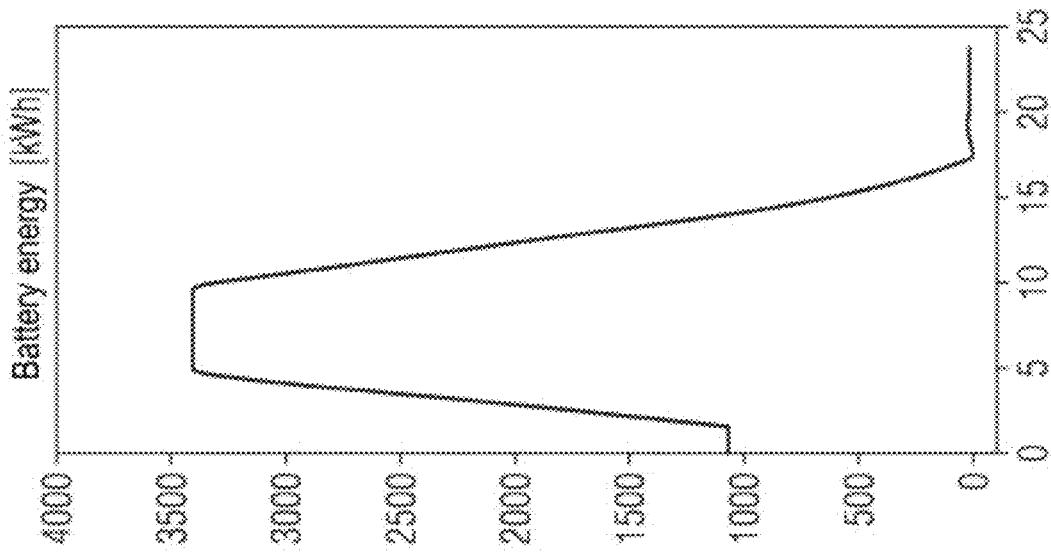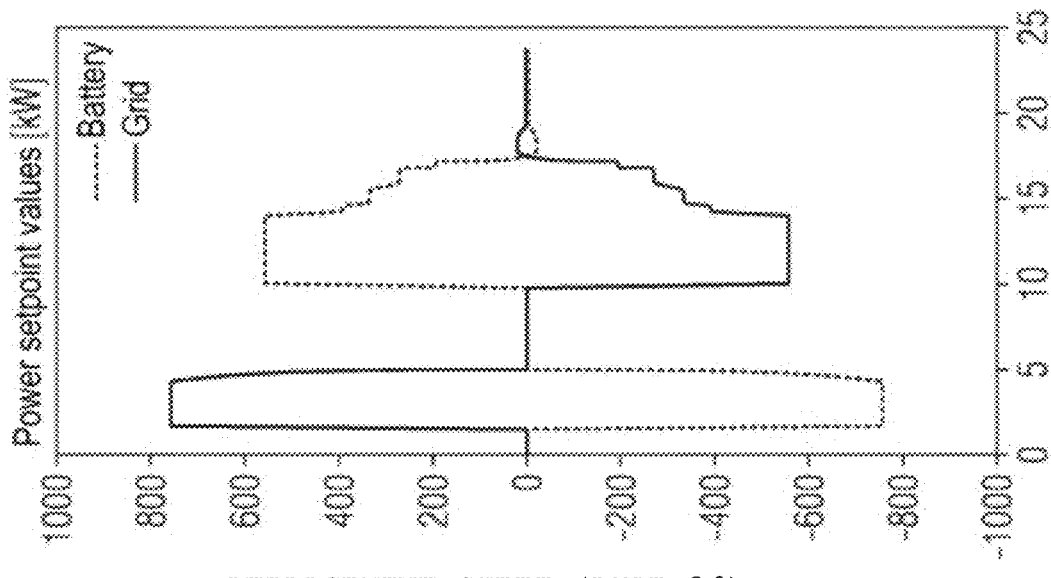

METHOD AND DEVICE FOR USING AN ELECTROCHEMICAL ENERGY STORE SO AS TO OPTIMIZE THE SERVICE LIFE

CROSS-REFERENCE TO RELATED APPLICATIONS

This application claims priority to PCT Application No. PCT/EP2016/058281, having a filing date of Apr. 14, 2016, the entire contents of which are hereby incorporated by reference.

FIELD OF TECHNOLOGY

The following relates to a method and a device for using an electrochemical energy store so as to optimize the service life. The following also relates to a computer program product and to a computer-readable medium.

BACKGROUND

In order to determine the service life and the associated economic benefit of an electrochemical energy store in an energy system, the aging of the energy store should be taken into account.

Energy stores, for example batteries, allow the generation and consumption of electrical energy to be temporally decoupled: if energy is (favorably) available at low-load times, the energy store should be charged. If energy is available at high-load times only with expenditure, the energy store should be discharged. Since the procurement of such energy stores which can be charged and discharged is costly (currently more than 100 euros per kWh) and such energy stores are subject to chemical aging processes, operation or use of these energy stores which avoids expenditure and saves resources is useful in order to delay their aging as far as possible. A distinction can be made between calendar (that is to say purely temporal) and cyclic (that is to say operation-dependent) aging. In addition to the energy throughput, the battery temperature is a main influencing factor in cyclic aging. Charging and discharging operations result in a temperature increase, wherein activation energy needs to be overcome at the molecular level during the charging and/or discharging process of the energy store. The influence of the temperature on the aging is quantified by the law of Arrhenius and can result in aging which is more than twice as fast in the case of a temperature increase by 10 degrees, for example. The temperature-dependent factor $f(T)$ is given by the law of Arrhenius:

$$f(T)=\exp(-E_a/(R*T))$$

The activation energy $E_a$ and the universal gas constant R are known parameters therein, wherein these parameters depend on the chemistry of the energy store and are possibly experimentally determined, and T is the temperature in Kelvin.

DE 102015205171.4 has already proposed a method for charging or discharging an electrochemical energy store, the aging behavior of which is modeled by means of a description of its depth of discharge (DoD).

It is necessary to find a balance between the time-dependent energy load and the associated costs and the battery aging, wherein the physical limits and resulting temperature profiles should be heeded.

In many applications, the operational control of the use of the battery or energy store is optimized with the aid of mathematical methods. In particular, the mixed integer linear programming (MILP) method can be used in this case.

Linear optimization deals with optimizing linear target functions over a set which is restricted by linear equations and inequations. It is the basis of the solution methods of (mixed) integer linear optimization (MILP). A so-called solver, for example CPLEX, Gurobi, is a collective term for special mathematical computer programs which can numerically solve mathematical optimization problems.

Simplified battery models have hitherto mostly been used to reduce the complexity of the optimization problems which occur (see, for example, [1]). However, the simplifications in the modeling of the batteries, which either completely disregard aging dynamics or inadequately simplify them, often result in great discrepancies between the predicted performance and the actual performance of the battery with respect to the service life and the resulting costs.

DE 10 2014 215309 discloses a method for determining a state of health of energy stores, which method uses a simplified, non-linear model.

DE 10 2009 024422 A1 discloses a method for estimating the service life of an energy store. The estimate is created on the basis of representative profiles, which have been statistically collected, and the input variables of current I, state of charge SoC, depth of discharge DoD and temperature T over the service life of the battery.

SUMMARY

An aspect relates to a method or technique for using an electrochemical energy store so as to optimize the service life, which method or technique is improved in comparison with the prior art mentioned, wherein energy load times and aging of the energy store are intended to be taken into account.

The invention claims a method for using an electrochemical energy store so as to optimize the service life or resource consumption, wherein the cyclic aging of the energy store is expressed in the form of a non-linear function on the basis of the temperature (T), which can be influenced by a charging and/or discharging process of the energy store, and the energy throughput ($\Delta E$), characterized in that the non-linear function for determining the cyclic aging is linearly approximated in each of the time steps which can be predefined for the purpose of subdividing a predefinable usage planning period and, by integrating the resulting model into a mixed integer optimization tool, usage planning for using the energy store so as to optimize the service life is calculated.

Optimizing the resource consumption relates to the "energy store" resource, wherein a lower resource consumption generally entails an increased service life of the energy store.

In contrast to the patent application mentioned at the outset in which large charging cycles are divided into small charging cycles, the present invention identifies suitable time steps for charging/discharging. Both approaches mentioned can complement each other and can be used independently of one another. The depth of discharge mentioned at the outset does not play any role in the invention.

The invention contributes to determining charging and discharging periods of an energy store and the electrical power used in the process, taking into account the temperature-dependent cyclic aging, in such a manner that the service life and therefore also the economic benefit of the energy store are maximized. This is achieved by means of a linear approximation model for the cyclic aging behavior of an energy store on the basis of the energy throughput and the temperature. The linear approximation of the non-linear, non-convex dynamics of the cyclic aging on the basis of the temperature and energy throughput reflects the experimentally confirmed aging processes in energy stores very well. The resulting model can be integrated into a mixed integer linear optimization tool for complex applications.

In comparison with the methods mentioned at the outset, the invention has the advantage of better approximation of the actual aging dynamics and the associated operating costs. With respect to the direct use of the non-linear models mentioned at the outset, the approach according to the invention provides greatly improved performance in complex, but run-time-critical applications with planning optimization at the run time.

In order to linearize the non-linear relationship with two arguments (temperature and energy throughput), the non-linear function is approximated by means of one or more planes which can represent one or more tangent planes. In this case, the number of planes can be stipulated. The usage planning period for using the energy store can be predefined as 24 hours, for example. The predefinable time steps are generally discrete. For example, the usage planning period can be subdivided into time steps of 1 or 2 hours, wherein the time steps can be predefined by a user. The time steps can be temporally equidistant.

A maximum charging power and/or maximum discharging power of the energy store can be included in the calculation of the approximation as input variables, wherein these input variables as threshold values are not intended to be exceeded. A minimum temperature and a maximum temperature of the energy store can be included in the calculation of the approximation as further input variables, wherein these input variables as threshold values are not intended to be undershot and exceeded.

Another aspect of the invention provides a device for using an electrochemical energy store so as to optimize the service life or resource consumption, wherein the cyclic aging of the energy store can be expressed in the form of a non-linear function on the basis of the temperature, which can be influenced by a charging and/or discharging process of the energy store, and the energy throughput, wherein the device is designed to linearly approximate the non-linear function for determining the cyclic aging in each of the time steps which can be predefined for the purpose of subdividing a predefinable usage planning period and, by integrating the resulting model into a mixed integer optimization tool, to use it to calculate usage planning for using the energy store so as to optimize the service life.

The device may provide means and/or units or apparatuses and/or modules for carrying out the above-mentioned method which may each be in the form of hardware and/or firmware and/or software or a computer program or computer program product.

The installation may be characterized, inter alia, by one of the following installation types. Examples are:

an energy generation installation, and
an energy network.

Another aspect of the invention is a computer program product or a computer program having means for carrying out the above-mentioned method when the computer program (product) is executed in an above-mentioned device or in means of the device. The computer program or computer program product may be stored on a computer-readable medium. The computer program or computer program product may be created in a conventional programming language (for example C++, Java). The processing apparatus may comprise a computer or server which is conventional on the market and has corresponding input, output and storage means. This processing apparatus may be integrated in the device or in the means of the latter.

BRIEF DESCRIPTION

Some of the embodiments will be described in detail, with references to the following Figures, wherein like designations denote like members, wherein:

FIG. 5 shows an illustration of the approximation error for k=100;

FIG. 6a shows assumed energy costs and rewards as a time series in a first example scenario;

FIG. 6b shows assumed energy costs and rewards as a time series in a second example scenario;

FIG. 6c shows assumed energy costs and rewards as a time series in a third example scenario;

DETAILED DESCRIPTION

The cyclic aging dynamics of an energy store, here using the example of a battery, can be modeled as follows on the basis of the temperature T and the energy throughput $\Delta E$ (see [2]):

$$\text{Cyclic aging coefficient} = g(\Delta E, T) = c_1 * \Delta E * f(T) = c_1 * \Delta E * \exp(-c_2/T) \qquad (0)$$

The parameters $c_1$ and $c_2$ can be used to adapt the non-linear model function $g(\Delta E, T)$ to the specific design of the battery. These parameters are usually experimentally estimated.

Figure 1:
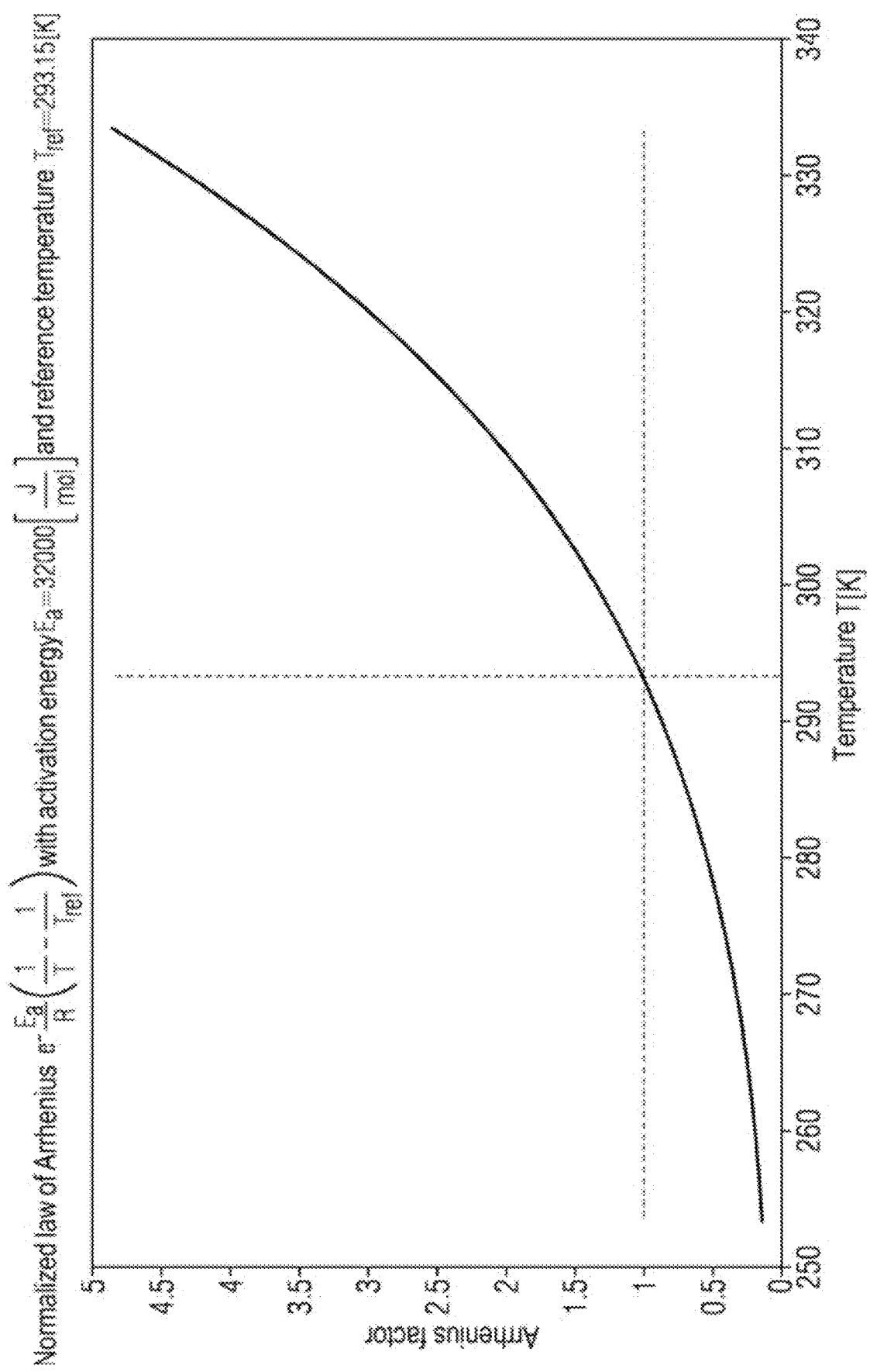
FIG. 1 shows an illustration of the law of Arrhenius.

FIG. 1 illustrates the law of Arrhenius, wherein the temperature in Kelvin [K] is plotted on the x axis of the graph in FIG. 1 and the Arrhenius factor is plotted on they axis if the activation energy is $E_a$=3200 [J/mol] and the reference temperature is $T_{ref}$=293.15 [K].

The cyclic aging of the energy store, for example a battery, in euros per hour and per kilowatt of charging/discharging power at a temperature T in Kelvin can be quantified by means of the formula $$A(T) = A_{ref} * \exp(M/T_{ref} - M/T) \qquad (1),$$

wherein $A_{ref}$ are the battery aging costs per kilowatt hour at the reference temperature $T_{ref}$. This constant $A_{ref}$ can be calculated by means of the quotient of the procurement costs of the battery in euros and the energy throughput until the end of the service life at a constant temperature $T_{ref}$ in kilowatt hours. Furthermore, $M=E_a/R$ is the quotient of the activation energy and universal gas constant in the law of Arrhenius. This quotient is usually determined by measuring the aging at two different temperatures.

Since the energy throughput ΔE is the product of the power P and the time step length Δt, it follows with (1) from (0) that the cyclic aging coefficient can be represented as:

$$g(P,T) = \Delta t^* P^* A(T) = A_{ref}^* \exp(M/T_{ref})^* \Delta t^* P^* \exp(-M/T) \quad (2)$$

Further input variables of the battery are its maximum charging power $P_{max,laden}$ and discharging power $P_{max,entladen}$ in kilowatts which are not intended to be exceeded. Furthermore, the temperature profile is not intended to leave the permissible range of $T_{min}$ to $T_{max}$. This range contains $T_{ref}$. In order to consider the formula (2) during the service-life-optimum and cost-optimum planning of the use of the battery, a preview horizon H is selected, which horizon is typically 24 hours and is broken down into N suitable successive intervals of time. The length of the nth interval of time is $\Delta t_n$. An electricity price prediction $K_n$ in euros per kilowatt hour is available for each of these intervals of time.

Figure 2:
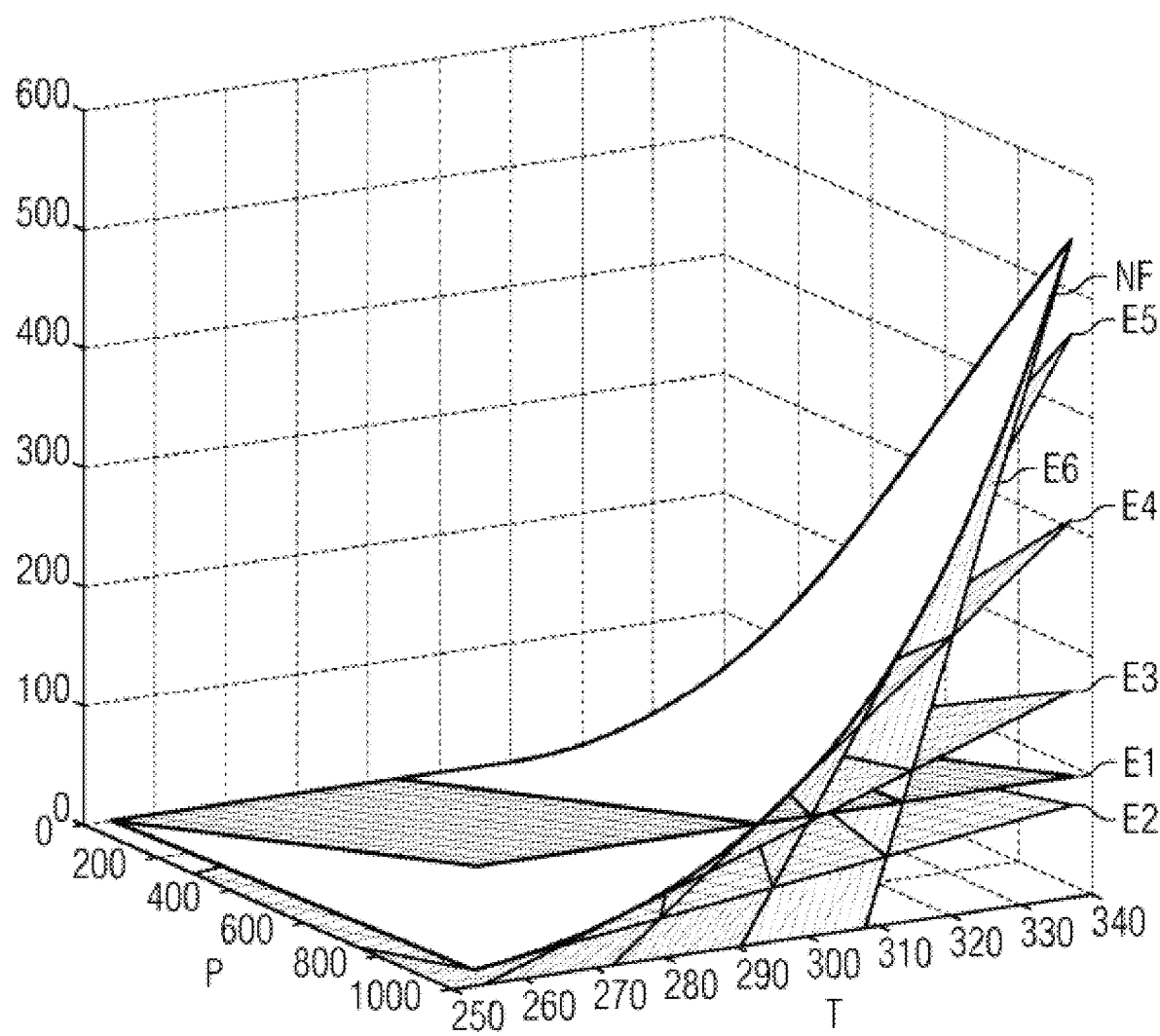
FIG. 2 shows a linear approximation with a value of k=4.
Figure 3:
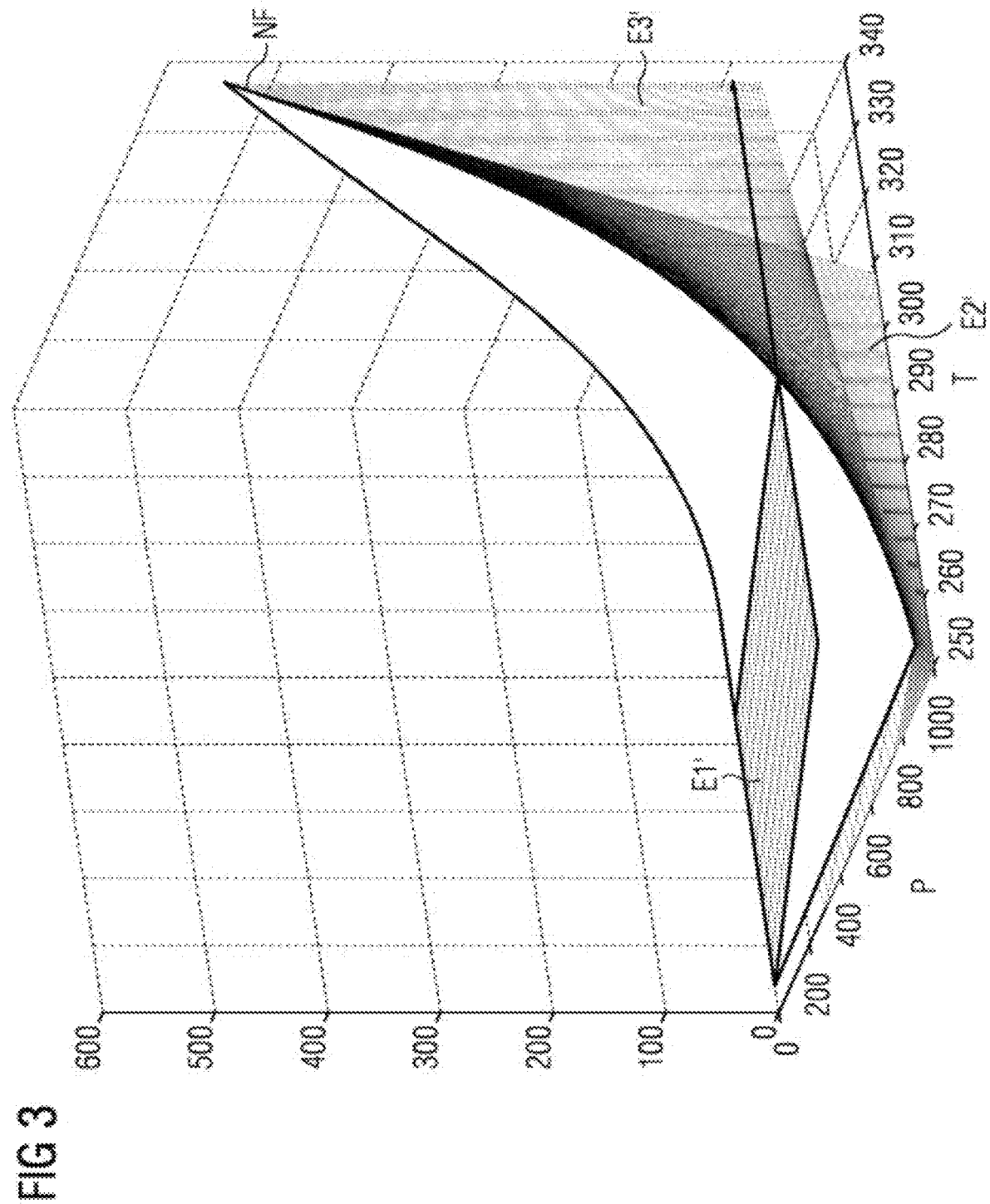
FIG. 3 shows a linear approximation with a value of k=100.
Figure 4:
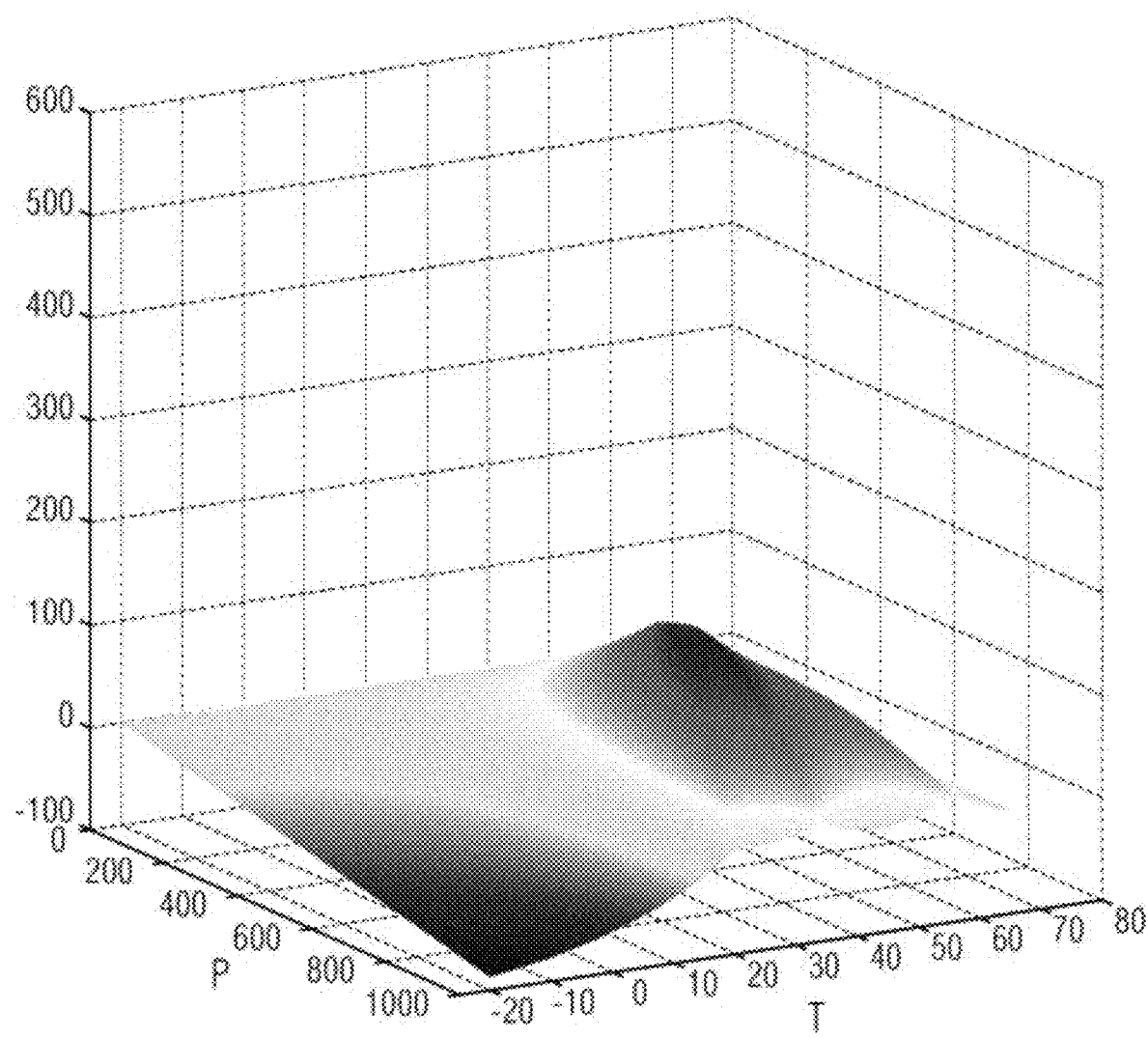
FIG. 4 shows an illustration of the approximation error for k=4.

The non-linear model (2) for the cyclic aging, which can be specified for discrete time steps, is now intended to be approximated with the aid of a linear model. The aging in each time step or interval of time can be expressed by means of a non-linear function on the basis of the respective power point $P_n$ and the temperature $T_n$. In order to linearize this non-linear relationship with two arguments, a plane approximation is used. The non-linear model function NF is illustrated in FIGS. 2 and 3.

The behavior of the energy system can be modeled using the mixed integer linear programming (MILP) in order to minimize the expenditure. The MILP can be used to find solutions with a very good quality of results in a relatively short run time.

The present MILP model can be considered only to be a possible exemplary formulation and does not constitute a restriction for the method.

The steps of the MILP program can be iteratively carried out and the program can be aborted when a previously stipulated time limit or quality of results is reached.

In the proposed model, the charging/discharging powers are given by the variables $P_n$ and the temperature of the battery is given by $T_n$ for each interval of time n∈{1, ..., N}.

A positive value of $P_n$ means charging of the battery, and a negative value means discharging. In order to now take into account the cyclic aging, an additional battery cost variable $C_n$ is generated for each interval of time and the sum $C_1+C_2+\ldots+C_N$ of the cost function is added. Each of these cost variables is subject to conditions of the form: for all k $$C_n \geq a_{k,n} + b_{k,n}^* T_n + c_{k,n}^* P_n \quad (3a)$$

$$C_n \geq a'_{k,n} + b'_{k,n}^* T_n - c'_{k,n}^* P_n \quad (3b).$$

The conditions ensure that the law of Arrhenius (1) is approximately simulated and is taken into account in the calculation of the costs.

In equation (3a) describes the cyclic aging costs as a result of charging and in equation (3b) describes those for discharging. Each of the conditions (3a) and (3b) constitutes a plane as the lower limit of the cyclic aging costs in the time step n and is linear. In this case, k runs through the range of integers from 0 to K, where K is a parameter of the method and typically has a value between 0 and 10.

For k=0, $a_{0,n}=0$, $b_{0,n}=0$, $c_{0,n}=\Delta t_n^* A(T_{ref})$ and $a'_{0,n}=0$, $b'_{0,n}=0$, $c'_{0,n}=\Delta t_n^* A(T_{ref})$ are set. These basic planes, which are indicated by E1 and E1' in FIGS. 2 and 3, ensure that at least the corresponding costs at the reference temperature are paid in a manner independent of the temperature. The model therefore contains the specific case of the temperature-independent aging costs at the reference temperature.

For k≥1, the increase in the aging costs in the event of temperature increases is modeled with the aid of further inequations: for k∈{1, ..., K+1}, $T_{app,k}=T_{min}+(T_{max}-T_{min})^*(k-1)/K$ is set. The coefficients $a_{k,n}$, $b_{k,n}$, $c_{k,n}$ in in equation (3a) should now be determined in such a manner that the plane of all points (P, T, C), which is defined by the plane equation $C=a_{k,n}+b_{k,n}^* T+c_{k,n}^* P$, constitutes a tangent plane to the function $\Delta t_n^* P + A(T)$ at the point ($P_{max,laden}$, $T_{app,k}$, $\Delta t_n^* P_{max,laden}^* A(T_{app,k})$) and runs through the point (0, $T_{max}$, 0). In a similar manner, the coefficients $a'_{k,n}$, $b'_{k,n}$, $c'_{k,n}$ in in equation (3b) should be determined in such a manner that the plane of all points (P, T, C), which is defined by the plane equation $C=a'_{k,n}+b'_{k,n}^* T-c'_{k,n}^* P$, constitutes a tangent plane to the function $\Delta t_n^* P^* A(T)$ at the point ($P_{max,entladen}$, $T_{app,k}$, $\Delta t_n^* P_{max,entladen}^* A(T_{app,k})$) and runs through the point (0, $T_{max}$, 0). The tangent planes are indicated by E2 to E6 in FIG. 2 and by E2', E3' in FIG. 3.

Applications are possible in which the correct inclusion of the cyclic aging costs of energy stores, for example batteries, is a decisive factor for the service-life-optimized and cost-optimal operational and usage planning. This plays a role, in particular, in the context of so-called smart energy grids and energy stores.

An example scenario which illustrates the consideration of cyclic aging costs in the planning of the use of a battery in a highly simplified smart grid application is described below without being restricted to this example or this application. A time horizon of 24 hours is considered, in which a battery which is connected to the grid can take energy from or can feed energy into the grid. Costs become due or rewards are paid out for this. The assumed costs and rewards are illustrated as a time series in FIG. 6c. It is seen that the energy is favorable at low-load times, for example at night, and is unfavorable at high-load times during the day. The MILP program for controlling the use of a battery so as to optimize the service life uses these circumstances. During the night, the battery is charged with power and it feeds power into the grid again during the day (see power set points in FIG. 6a and battery energy in FIG. 6b).

Figure 7A:
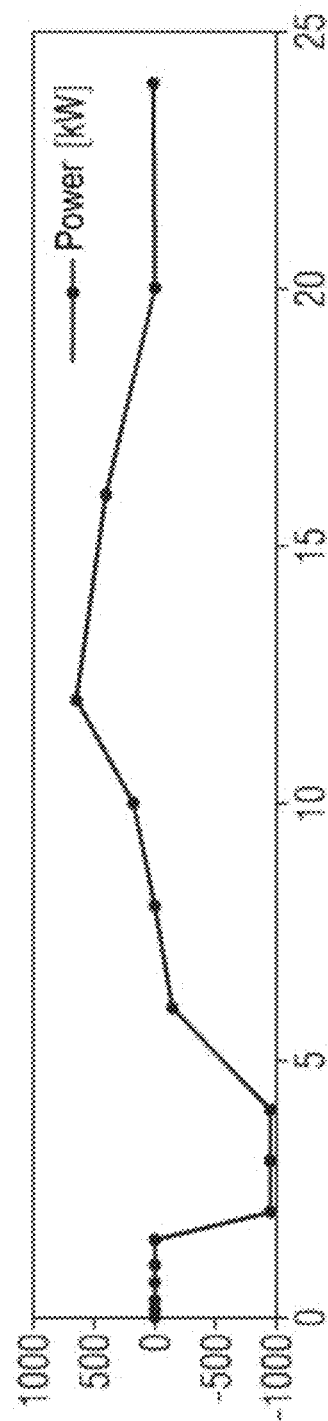
FIG. 7a shows the corresponding charging/discharging power, the temperature and the costs resulting from the cyclic aging, in a first example.
Figure 7B:
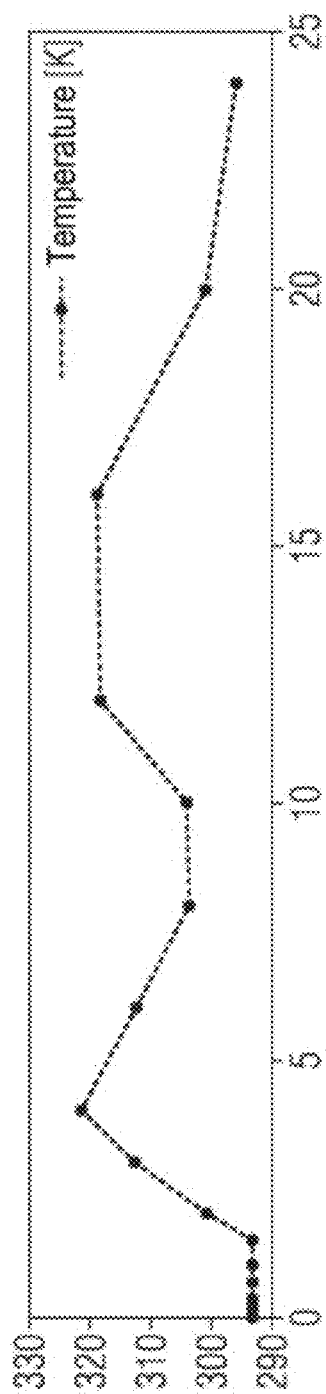
FIG. 7b shows the corresponding charging/discharging power, the temperature and the costs resulting from the cyclic aging, in a second example.
Figure 7C:
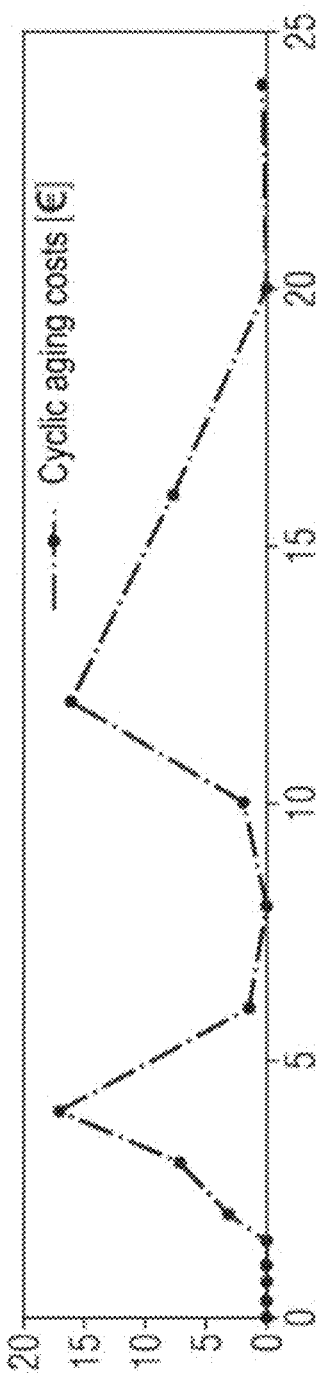
FIG. 7c shows the corresponding charging/discharging power, the temperature and the costs resulting from the cyclic aging, in a third example.

FIGS. 7a, 7b and 7c show the corresponding charging/discharging power (FIG. 7a), the temperature (FIG. 7b) and the cyclic aging costs (FIG. 7c) which were calculated on the basis of the linearized model.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for using an electrochemical energy store so as to optimize a service life, wherein a cyclic aging of the energy store is expressed in a form of a non-linear function on a basis of a temperature, which is influenced by a charging and/or discharging process of the energy store, and an energy throughput, wherein the non-linear function for determining the cyclic aging is expressed by:

$$g(P,T) = A_{ref}^* \exp(M/T_{ref})^* \Delta t^* P^* \exp(-M/T),$$

where $A_{ref}$ is a constant calculated by means of a quotient of procurement costs and the energy throughput until an end of the service life at a constant temperature $T_{ref}$, M is a quotient of an activation energy and an universal gas constant in the law of Arrhenius, P is a power and T is the temperature, is linearly approximated by means of one or more planes in each of the time steps which are predefined for the purpose of subdividing a predefinable usage planning period and, by integrating a resulting model into a mixed integer optimization tool for complex applications, usage planning with optimized resource consumption for using the energy store so as to optimize the service life is calculated, wherein a solver is used as the optimization tool.

2. The method as claimed in claim 1, wherein a number of the one or more planes for the approximation is stipulated.

3. The method as claimed in claim 1, wherein at least one of the one or more planes is a tangent plane.

4. The method as claimed in claim 1, wherein a maximum charging power and/or a maximum discharging power of the energy store is/are included in the calculation of the approximation as input variables, wherein these input variables as threshold values are not intended to be exceeded.

5. The method as claimed in claim 1, wherein a minimum temperature and a maximum temperature of the energy store are included in the calculation of the approximation as input variables, wherein these input variables as threshold values are not intended to be undershot and exceeded.

6. A computer program product, comprising a computer readable hardware storage device storing a computer readable program code, the computer readable program code comprising an algorithm that when executed by a computer processor of a computing system implements a method as claimed in claim 1.

7. A computer-readable medium comprising instructions which, when executed on a processing apparatus or the device or in one or more means of the device as claimed in claim 1, cause the computer or the device or the means to carry out the method.

8. A device for using an electrochemical energy store so as to optimize a service life, wherein a cyclic aging of the energy store is expressed in a form of a non-linear function on a basis of a temperature, which is influenced by a charging and/or discharging process of the energy store, and the energy throughput, wherein the device is designed to linearly approximate the non-linear function for determining the cyclic aging, which is expressed by:

$$g(P,T)=A_{ref}*\exp(M/T_{ref})*\Delta t*P*\exp(-M/T),$$

where $A_{ref}$ is a constant calculated by means of a quotient of procurement costs and an energy throughput until an end of the service life at a constant temperature $T_{ref}$, M is a quotient of an activation energy and a universal gas constant in the law of Arrhenius, P is a power and T is the temperature, by means of one or more planes in each of the time steps which is predefined for the purpose of subdividing a predefinable usage planning period and, by integrating a resulting model into a mixed integer optimization tool for complex applications, to use the imxed integer optimization tool to calculate usage planning with optimized resource consumption for using the energy store so as to optimize the service life, wherein a solver is used as the optimization tool.

9. The device as claimed in the claim 8, wherein a number of the one or more planes is stipulated.

10. The device as claimed in claim 8 wherein at least one of the one or more planes is a tangent plane.

11. The device as claimed in claim 8, wherein a maximum charging power and/or a maximum discharging power of the energy store is/are included in the calculation of the approximation as input variables, wherein these input variables as threshold values are not intended to be exceeded.

12. The device as claimed in claim 8, wherein a minimum temperature and a maximum temperature of the energy store are included in the calculation of the approximation as input variables, wherein these input variables as threshold values are not intended to be undershot and exceeded.

* * * * *